(12) United States Patent
Byeon

(10) Patent No.: US 8,169,232 B2
(45) Date of Patent: May 1, 2012

(54) APPARATUS AND METHOD FOR GENERATING RESISTANCE CALIBRATION CODE IN SEMICONDUCTOR INTEGRATED CIRCUIT

(75) Inventor: Sang Jin Byeon, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 379 days.

(21) Appl. No.: 12/478,201

(22) Filed: Jun. 4, 2009

(65) Prior Publication Data

US 2010/0036634 A1 Feb. 11, 2010

(30) Foreign Application Priority Data

Aug. 8, 2008 (KR) ........................ 10-2008-0077710

(51) Int. Cl.
  H03K 17/16 (2006.01)
  H03K 19/003 (2006.01)
  H03K 19/094 (2006.01)
  H03K 3/00 (2006.01)
  H03B 1/00 (2006.01)

(52) U.S. Cl. ............................ 326/30; 326/87; 327/170

(58) Field of Classification Search .................... 326/30; 327/108, 170, 172–176
  See application file for complete search history.

(56) References Cited

U.S. PATENT DOCUMENTS

| | | | |
|---|---|---|---|
| 6,307,424 B1 * | 10/2001 | Lee | 327/530 |
| 6,833,725 B2 * | 12/2004 | Ohkawa et al. | 324/750.3 |
| 6,839,286 B2 * | 1/2005 | Cho et al. | 365/189.05 |
| 6,947,336 B2 * | 9/2005 | Kim et al. | 365/189.05 |
| 6,965,839 B2 | 11/2005 | Floyd et al. | |
| 7,288,966 B2 * | 10/2007 | Choi et al. | 326/83 |
| 7,292,953 B2 | 11/2007 | Jung | |
| 7,589,554 B2 * | 9/2009 | Hamanaka | 326/30 |
| 7,663,946 B2 * | 2/2010 | Kim | 365/194 |
| 2005/0134304 A1 * | 6/2005 | Lee | 326/30 |
| 2005/0180229 A1 * | 8/2005 | Jin | 365/194 |
| 2007/0216441 A1 | 9/2007 | Nemoto et al. | |
| 2009/0102510 A1 * | 4/2009 | Park | 326/30 |
| 2009/0289658 A1 * | 11/2009 | Moon | 326/30 |
| 2010/0045340 A1 * | 2/2010 | Park | 326/30 |
| 2010/0134257 A1 * | 6/2010 | Puleston et al. | 340/10.4 |
| 2011/0090015 A1 * | 4/2011 | Sumita et al. | 331/56 |
| 2011/0163778 A1 * | 7/2011 | Moon | 326/30 |
| 2011/0193590 A1 * | 8/2011 | Nakagawa et al. | 326/30 |

FOREIGN PATENT DOCUMENTS

KR 1020080002692 A 1/2008

* cited by examiner

*Primary Examiner* — Shawki S Ismail
*Assistant Examiner* — Dylan White
(74) *Attorney, Agent, or Firm* — IP & T Group LLP

(57) ABSTRACT

A resistance calibration code generating apparatus includes a code calibration unit configured to calibrate and output code values of a resistance calibration code during predetermined cycles of a calibration clock, which are determined by a code calibration time control command, and a calibration clock generating unit configured to output the calibration clock using a code calibration command.

7 Claims, 3 Drawing Sheets

APPARATUS AND METHOD FOR GENERATING RESISTANCE CALIBRATION CODE IN SEMICONDUCTOR INTEGRATED CIRCUIT

CROSS-REFERENCES TO RELATED APPLICATION

The present application claims priority under 35 U.S.C. 119(a) to Korean application number 10-2008-0077710, filed on Aug. 8, 2008, in the Korean Intellectual Property Office, the contents of which are incorporated herein by reference.

BACKGROUND

1. Technical Field

The embodiments described herein relate to an apparatus and a method for generating resistance calibration codes for use in a semiconductor integrated circuit.

2. Related Art

Resistance calibration codes are used to cope with a PVT (Process, Voltage, and Temperature) fluctuation by controlling on-resistance and on-die termination (ODT) and these codes are controlled by a resistance calibration code generating apparatus.

FIG. 1 is a block diagram illustrating a conventional resistance calibration code generating apparatus in a semiconductor integrated circuit.

As shown in FIG. 1, the conventional resistance calibration code generating apparatus includes a code calibration unit 10 and a state machine 20.

The code calibration unit 10 is configured to output resistance calibration codes 'PCODE<0:N>' and 'NCODE<0:N>' using code calibration time control commands 'ZQINIT', 'ZQOPER' and 'ZQCS', a delayed clock signal 'CLKD', and a reference voltage 'VREF'. The code calibration unit 10 is connected to an external resistor RZQ through a ZQ pin.

The state machine 20 is configured to selectively activate the code calibration time control commands 'ZQINIT', 'ZQOPER' and 'ZQCS' using an external clock 'CLK' according to logic levels of a code calibration command 'ZQC' and an address signal 'A10'. A reset signal 'RST' is used as an initialization signal to initialize the state machine 20.

An operation of the code calibration is executed in an idle state of the semiconductor integrated circuit.

After the code calibration command 'ZQC' is activated, the state machine 20 generates the code calibration time control commands 'ZQINIT', 'ZQOPER' and 'ZQCS' based on the external clock 'CLK'. The code calibration time control commands 'ZQINIT', 'ZQOPER' and 'ZQCS' are produced in synchronization with the external clock 'CLK'.

The code calibration time control command 'ZQINIT' is activated when both the code calibration command 'ZQC' and the address signal 'A10' are in a high level and this defines a first carried out code calibration after the power-up. The code calibration time control command 'ZQINIT' may give instructions to carry out the code calibration for 512 cycles of the external clock 'CLK'.

In the case where both the code calibration command 'ZQC' and the address signal 'A10' are in a high level, the code calibration time control command 'ZQOPER' is activated. However, the code calibration time control command 'ZQOPER' defines a code calibration after the first code calibration is carried out. The code calibration time control command 'ZQOPER' may give instructions to carry out the code calibration for 256 cycles of the external clock 'CLK'.

The code calibration time control command ZQCS is activated when only the code calibration command 'ZQC' is in a high level, and may give instructions to carry out a code calibration for 64 cycles of the external clock 'CLK'.

The external clock 'CLK' may be set up differently in time period within a predetermined range for operating features of a processor in a mobile apparatus.

As mentioned above, the code calibration time control commands 'ZQINIT', 'ZQOPER' and 'ZQCS' are executed during the cycles of the predetermined external clock 'CLK'. Accordingly, the longer the time period of the external clock 'CLK' is, the more it takes time to execute the code calibration and the more the power consumption is needed.

The conventional resistance calibration code generating apparatus has the following problems because it carries out the code calibration based on the external clock 'CLK'.

First, since it takes a lot of time to execute the code calibration with the long time period of the external clock 'CLK', it has a disadvantage in terms of the operating time. Second, since the power consumption is increased with the long time period of the external clock 'CLK', an operating time in a portable device, in which a semiconductor integrated circuit is embedded with a battery, is decreased.

SUMMARY

A resistance calibration code generating apparatus capable of reducing power consumption with a reduced code calibration time and a method thereof are described herein.

In one aspect, a resistance calibration code generating apparatus in a semiconductor integrated circuit comprises a code calibration unit configured to calibrate and output code values of a resistance calibration code during predetermined cycles of a calibration clock, which are determined by a code calibration time control command, and a calibration clock generating unit configured to produce the calibration clock using a code calibration command.

In another aspect, a method for generating a resistance calibration code in a semiconductor integrated circuit comprises producing a calibration clock and a code calibration time control command according to a code calibration command, and calibrating and outputting code values of a resistance calibration code during predetermined cycles of the calibration clock, which are determined by the code calibration time control command.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
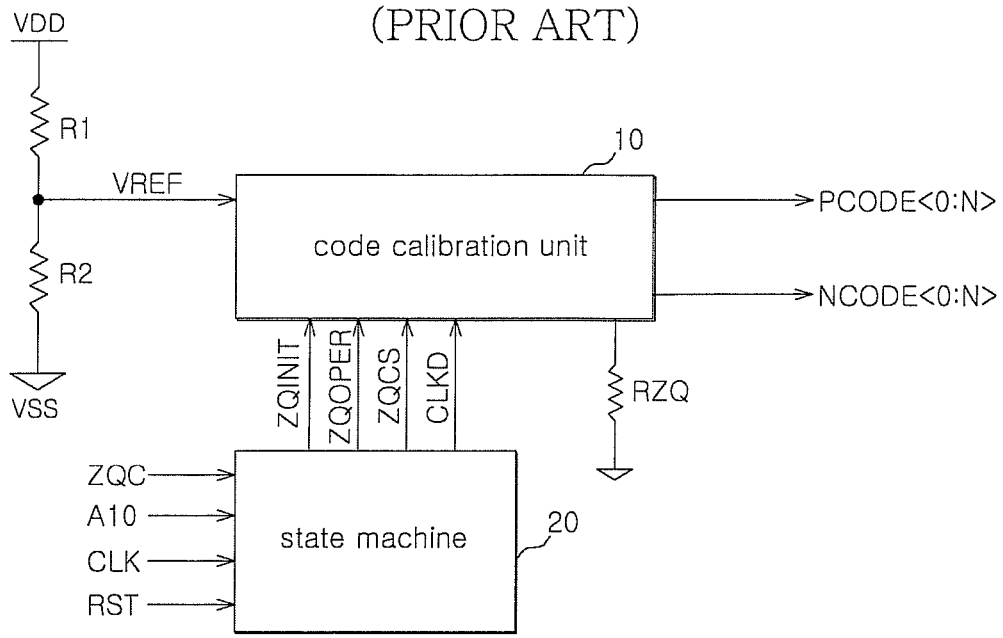
FIG. 1 is a block diagram illustrating a conventional resistance calibration code generating apparatus in a semiconductor integrated circuit.
Figure 2:
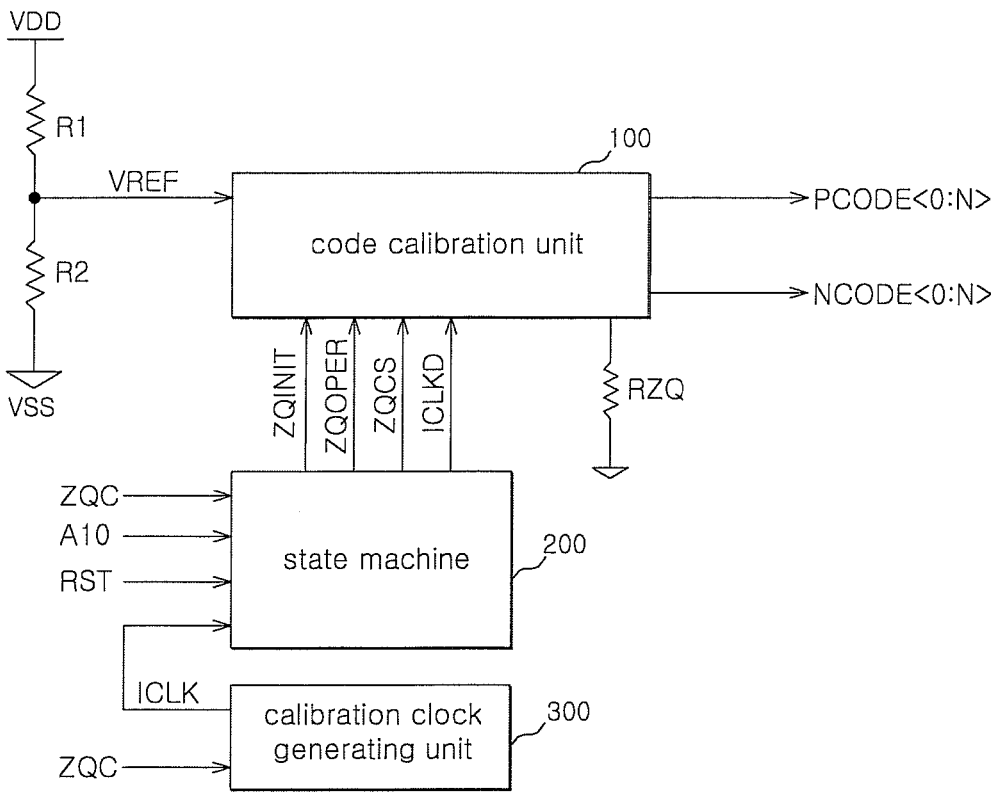
FIG. 2 is a block diagram illustrating an example of a structure of a resistance calibration code generating apparatus in a semiconductor integrated circuit according to an embodiment of the present invention.

FIG. 2 is a block diagram illustrating an example of a structure of a resistance calibration code generating apparatus in a semiconductor integrated circuit according to an embodiment of the present invention.

As shown in FIG. 2, the resistance calibration code generating apparatus according to one embodiment includes a code calibration unit 100, a state machine 200, and a calibration clock generating unit 300.

The code calibration unit 100 is configured to calibrate and output code values of the first and the second resistance calibration codes 'PCODE<0:N>' and ' NCODE<0:N>', respectively during the corresponding time of calibration clock cycles which are determined based on code calibration time control commands 'ZQINIT', 'ZQOPER' and 'ZQCS'.

The state machine 200 is configured to activate one of the code calibration time control commands 'ZQINIT', 'ZQOPER' and 'ZQCS' by combining a code calibration command 'ZQC' and an address signal 'A10' and output a delayed calibration clock 'ICLKD', which is produced by delaying a calibration clock 'ICLK' in synchronization with an activation timing of the code calibration time control commands 'ZQINIT', 'ZQOPER' and 'ZQCS', to the code calibration unit 100.

The code calibration time control command 'ZQINIT' is activated when both the code calibration command 'ZQC' and the address signal 'A10' are in a high level and this defines a first carried out code calibration after the power-up of a semiconductor integrated circuit. The code calibration time control command 'ZQINIT' may give instructions to carry out the code calibration for 512 cycles of the external clock 'CLK'.

In the case where both the code calibration command 'ZQC' and the address signal 'A10' are in a high level, the code calibration time control command 'ZQOPER' is activated. However, the code calibration time control command 'ZQOPER' defines a code calibration after the first code calibration is carried out. The code calibration time control command 'ZQOPER' may give instructions to carry out the code calibration for 256 cycles of the external clock 'CLK'.

The code calibration time control command 'ZQCS' is activated when only the code calibration command 'ZQC' is in a high level, and may give instructions to carry out a code calibration for 64 cycles of the external clock 'CLK'.

The calibration clock generating unit 300 is configured to produce the calibration clock 'ICLK' using the code calibration command 'ZQC'.

Figure 3:
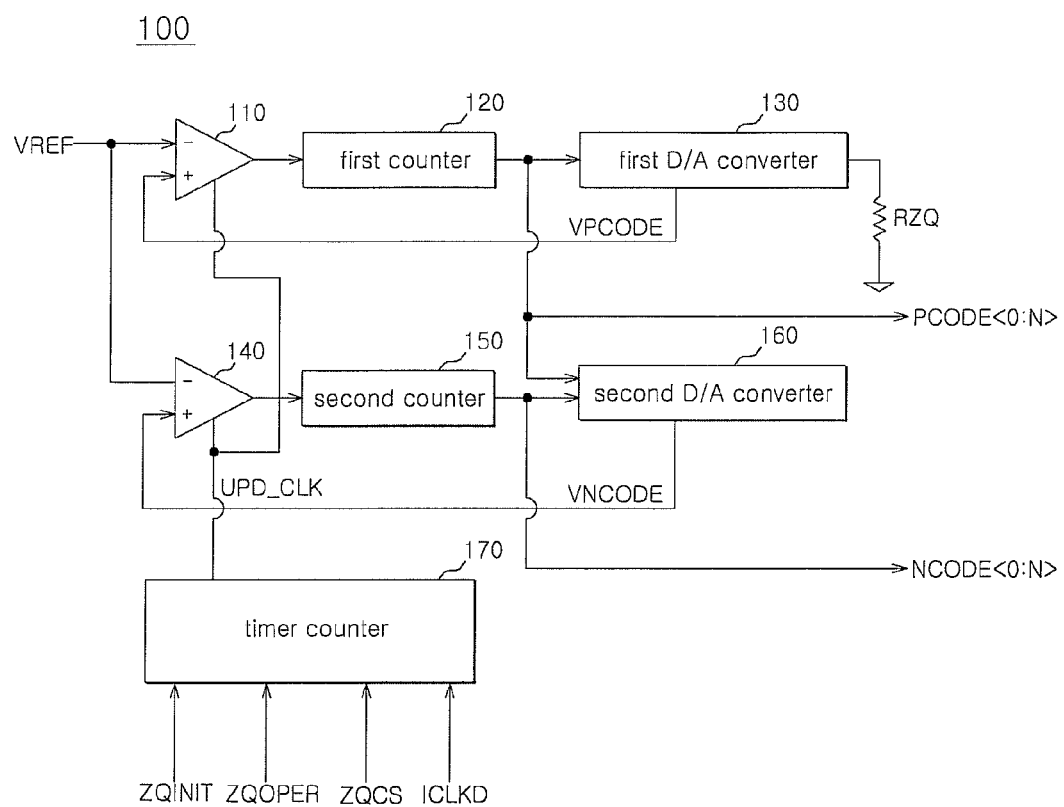
FIG. 3 is a block diagram illustrating an example of a structure of a code calibration unit of FIG. 2.

FIG. 3 is a block diagram illustrating an example of a structure of the code calibration unit of FIG. 2.

Referring to FIG. 3, the code calibration unit 100 includes a first comparator 110, a first counter 120, a first digital to analog (D/A) converter 130, a second comparator 140, a second counter 150, a second D/A converter 160, and a timer counter 170.

The first comparator 110 is configured to compare a reference voltage 'VREF' with a first code voltage 'VPCODE' according to an update clock 'UPD_CLK' and then output a comparison signal.

The first counter 120 is configured to increase or decrease the first resistance calibration code 'PCODE<0:N>' according to the comparison signal from the first comparator 110.

The first D/A converter 130 is configured to convert the first resistance calibration code 'PCODE<0:N>' into the first code voltage 'VPCODE'.

The second comparator 140 is configured to compare the reference voltage 'VREF' with a second code voltage 'VNCODE' according to the update clock 'UPD_CLK' and then output a comparison signal.

The second counter 150 is configured to increase or decrease the second resistance calibration code 'NCODE<0:N>' according to the comparison signal from the second comparator 120.

The second D/A converter 160 is configured to convert the second resistance calibration code 'NCODE<0:N>' into the second code voltage 'VNCODE'.

The timer counter 170 is configured to produce the update clock 'UPD_CLK' using the delayed calibration clock 'ICLKD', which is correspondent to a cycle determined according to the activated command of the code calibration time control commands 'ZQINIT', 'ZQOPER' and 'ZQCS', and then control the first and second comparators 110 and 140 using the update clock 'UPD_CLK'.

Figure 4A:
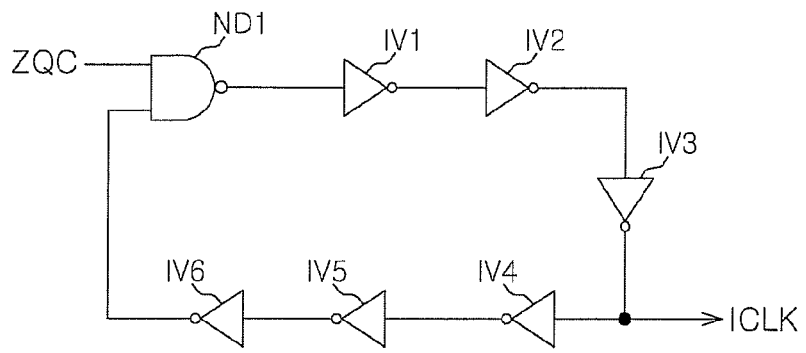
FIGS. 4A and 4B are circuit diagrams each of which illustrates an example of a structure of a calibration clock generating unit of FIG. 2.
Figure 4B:
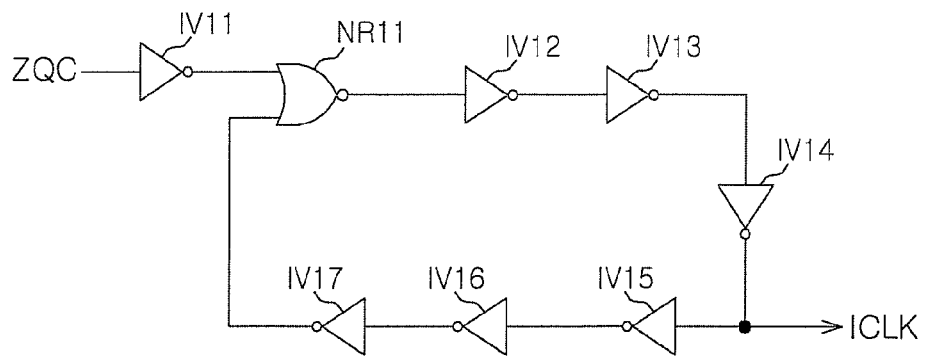

FIGS. 4A and 4B are circuit diagrams each of which illustrates an example of a structure of the calibration clock generating unit of FIG. 2.

The calibration clock generating unit 300 is configured to produce the calibration clock 'ICLK' in response to an activation of the code calibration command 'ZQC' and stop producing the calibration clock 'ICLK' when the code calibration command 'ZQC' is inactivated. The calibration clock generating unit 300 may be a ring oscillator. The calibration clock generating unit 300 may be implemented in various kinds of types and two types of them are shown in FIGS. 4A and 4B, respectively.

The calibration clock generating unit 300 in FIGS. 4A and 4B may be designed in such a manner that the calibration clock 'ICLK' is the same as a minimum value of a time period (tCK) of the external clock 'CLK' which is provided from an external circuit of the semiconductor integrated circuit, or less than a range which is taken into consideration of operating frequency of the code calibration unit 100. Accordingly, even if the time period (tCK) of the external clock 'CLK' is varied from a minimum value to a maximum value, a time period (tCK) of the calibration clock 'ICLK' according to one embodiment is maintained below the minimum value of the time period (tCK) of the external clock 'CLK'.

As shown in FIG. 4A, the calibration clock generating unit 300 according to one embodiment includes a NAND gate ND1 and a plurality of inverters IV1 to IV6. The code calibration command ZQC is input into a first input terminal of the NAND gate ND1. An output signal of the NAND gate ND1 is sequentially inverted by the plurality of inverters IV1 to IV6 and a final output signal of the inverter IV6 is input into a second input terminal of the NAND gate ND1. The calibration clock 'ICLK' is output from the inverter IV3.

As shown in FIG. 4B, the calibration clock generating unit 300 according to another embodiment includes a NOR gate NR11 and a plurality of inverters IV11 to IV17. The inverter IV11 inverts the code calibration command ZQC and this inverted command is input into a first input terminal of the NOR gate NR11. An output signal of the NOR gate NR11 is sequentially inverted by the plurality of inverters IV12 to IV17 and a final output signal of the inverter IV17 is input into a second input terminal of the NOR gate NR11. The calibration clock 'ICLK' is output from the inverter IV14.

The operation of the resistance calibration code generating apparatus of the semiconductor integrated circuit according to one embodiment will be described in detail below.

When the code calibration command 'ZQC' is activated, the calibration clock generating unit 300 produces the calibration clock 'ICLK' and outputs the calibration clock 'ICLK' to the state machine 200.

The state machine 200 activates one of the code calibration time control commands 'ZQINIT', 'ZQOPER' and 'ZQCS' according to the combination of the code calibration command 'ZQC' and the address signal 'A10' and outputs the delayed calibration clock 'ICLKD' by delaying the calibration clock 'ICLK' by a time required to activate one of the code calibration time control commands 'ZQINIT', 'ZQOPER' and 'ZQCS'.

The time (generation time of the code calibration time control command), which is required to activate one of the code calibration time control commands 'ZQINIT', 'ZQOPER' and 'ZQCS' according to the combination of the code calibration command 'ZQC' and the address signal 'A10', is almost constant. Accordingly, the calibration clock 'ICLK' may be output directly from the calibration clock generating unit 300 to the code calibration unit 100 through a delay element that has a delay time corresponding to the generation time of the code calibration time control command.

The code calibration unit 100 performs the calibration process of the first resistance calibration codes 'PCODE<0: N>' and the second resistance calibration codes 'NCODE<0: N>' during the time that a cycle of the calibration clock 'ICLK' is associated with the activation command of the code calibration time control commands 'ZQINIT', 'ZQOPER' and 'ZQCS'.

When the code calibration time control command 'ZQINIT' is activated, the code calibration unit 100 performs the calibration process during the time corresponding to 512 cycles of the calibration clock 'ICLK'.

When the code calibration time control command 'ZQOPER' is activated, the code calibration unit 100 performs the calibration process during the time corresponding to 256 cycles of the calibration clock 'ICLK'.

When the code calibration time control command 'ZQCS' is activated, the code calibration unit 100 performs the calibration process during the time corresponding to 64 cycles of the calibration clock 'ICLK'.

For example, assuming that a time period (tCK) of the external clock 'CLK' is regarded as a maximum value and the maximum value of the time period (tCK) of the external clock 'CLK' is twice of a minimum value of the time period (tCK) of the external clock 'CLK', the time period (tCK) of the calibration clock 'ICLK' is below a half of the external clock 'CLK'. Therefore, the code calibration processing time according to the embodiments can be reduced to less than a half of the prior art.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A resistance calibration code generating apparatus in a semiconductor integrated circuit comprising:
   a code calibration unit configured to calibrate and output code values of a resistance calibration code during predetermined cycles of a calibration clock, wherein the cycles of the calibration clock are determined by a code calibration time control command; and
   a calibration clock generating unit includes a ring oscillator to produce the calibration clock in response to an activation of the code calibration command.

2. The resistance calibration code generating apparatus of claim 1, further comprising a state machine configured to output the code calibration time control command by combining the code calibration command and an address signal, delay the calibration clock in synchronization with an output timing of the code calibration time control command, and output the delayed calibration clock to the code calibration unit.

3. The resistance calibration code generating apparatus of claim 2, wherein the code calibration time control command includes a plurality of commands and each command of the plurality of commands has different cycles of the calibration clock.

4. The resistance calibration code generating apparatus of claim 1, wherein the code calibration unit includes:
   a comparator configured to output a comparison signal by comparing a reference voltage and a code voltage;
   a counter configured to adjust the code values of the resistance calibration code according to the comparison signal;
   a digital to analog (D/A) converter configured to convert the resistance calibration code into the code voltage; and
   a timer counter configured to control the comparator using the calibration clock, wherein cycles of the calibration clock are predetermined by the code calibration time control command.

5. The resistance calibration code generating apparatus of claim 1, wherein the calibration clock generating unit does not output the calibration clock when the code calibration command is inactivated.

6. The resistance calibration code generating apparatus of claim 1, wherein the ring oscillator includes:
   a NAND gate having a first input terminal and a second input terminal, wherein the code calibration command is input into the first input terminal of the NAND gate; and
   a plurality of inverters configured to sequentially invert an output signal of the NAND gate and input the inverted signal into the second input terminal of the NAND gate.

7. The resistance calibration code generating apparatus of claim 1, wherein the ring oscillator includes:
   a NOR gate having a first input terminal and a second input terminal, wherein an inverted signal of the code calibration command is input into the first input terminal of the NOR gate; and
   a plurality of inverters configured to sequentially invert an output signal of the NOR gate and input the inverted signal into the second input terminal of the NOR gate.

* * * * *